United States Patent
Lan et al.

(10) Patent No.: US 11,356,140 B2
(45) Date of Patent: *Jun. 7, 2022

(54) CLOCK AND DATA RECOVERY CIRCUIT

(71) Applicant: Taiwan Semiconductor Manufacturing Co., Ltd., Hsin-Chu (TW)

(72) Inventors: Po-Hsiang Lan, Taipei (TW); Cheng-Hsiang Hsieh, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/320,568

(22) Filed: May 14, 2021

(65) Prior Publication Data

US 2021/0273674 A1 Sep. 2, 2021

Related U.S. Application Data

(63) Continuation of application No. 16/742,423, filed on Jan. 14, 2020, now Pat. No. 11,025,294, which is a
(Continued)

(51) Int. Cl.
*H04L 7/02* (2006.01)
*H04B 1/7085* (2011.01)
*H04L 7/00* (2006.01)

(52) U.S. Cl.
CPC ......... *H04B 1/7085* (2013.01); *H04L 7/0029* (2013.01); *H04B 2201/7073* (2013.01)

(58) Field of Classification Search
CPC .......... H04B 1/7085; H04B 2201/7073; H04L 7/0025; H04L 7/033; H04L 7/07; H04L 7/0814; H04L 7/0807; H04L 7/085; H04L 7/093; H03L 7/033; H03L 7/07; H03L 7/0814; H03L 7/0807; H03L 7/085; H03L 7/093

See application file for complete search history.

(56) References Cited

U.S. PATENT DOCUMENTS 7,571,360 B1 8/2009 Lewicki
10,224,978 B1 * 3/2019 Lan ....................... H04L 7/0029
(Continued)

*Primary Examiner* — Siu M Lee
(74) *Attorney, Agent, or Firm* — Duane Morris LLP

(57) ABSTRACT

Circuits and methods for performing a clock and data recovery are disclosed. In one example, a circuit is disclosed. The circuit includes an FSM. The FSM includes: a first accumulator, a second accumulator, and a third accumulator. The first accumulator is configured to receive an input phase code representing a phase timing difference between a data signal and a clock signal at each FSM cycle, to accumulate input phase codes for different FSM cycles, and to generate a first order phase code at each FSM cycle. The second accumulator is coupled to the first accumulator and configured to accumulate the input phase codes and first order phase codes for different FSM cycles, and to generate a second order phase code at each FSM cycle. The third accumulator is coupled to the second accumulator and configured to accumulate the input phase codes and second order phase codes for different FSM cycles, and to generate a third order phase code at each FSM cycle.

20 Claims, 8 Drawing Sheets

Related U.S. Application Data continuation of application No. 16/261,376, filed on Jan. 29, 2019, now Pat. No. 10,541,718, which is a continuation of application No. 15/938,264, filed on Mar. 28, 2018, now Pat. No. 10,224,978.

(60) Provisional application No. 62/546,124, filed on Aug. 16, 2017.

(56) References Cited

U.S. PATENT DOCUMENTS

| | | | |
|---|---|---|---|
| 10,541,718 B2* | 1/2020 | Lan | H03L 7/07 |
| 11,025,294 B2* | 6/2021 | Lan | H03L 7/07 |
| 2005/0180536 A1* | 8/2005 | Payne | H03L 7/0814 |
| | | | 375/354 |
| 2011/0255643 A1* | 10/2011 | Fu | H03L 7/0816 |
| | | | 375/371 |
| 2014/0126656 A1* | 5/2014 | Chung | H04L 7/0331 |
| | | | 375/259 |
| 2014/0140458 A1* | 5/2014 | Fu | H03L 7/00 |
| | | | 375/371 |

* cited by examiner

CLOCK AND DATA RECOVERY CIRCUIT

CROSS-REFERENCE TO RELATED APPLICATIONS

This application is a continuation application of U.S. patent application Ser. No. 16/742,423, filed Jan. 14, 2020, now U.S. Pat. No. 11,025,294, which is a continuation application of U.S. patent application Ser. No. 16/261,376, filed Jan. 29, 2019, now U.S. Pat. No. 10,541,718, which is a continuation of U.S. patent application Ser. No. 15/938,264, filed Mar. 28, 2018, now U.S. Pat. No. 10,224,978, which claims priority to U.S. Provisional Patent Application No. 62/546,124, filed Aug. 16, 2017, each of which is incorporated by reference herein in its entirety.

BACKGROUND

Digital data streams in wire-linked communication systems, such as Ethernet, FireWire, and other serial communication networks, are usually transmitted without an accompanying clock circuit. As such, a clock and data recovery (CDR) circuit is typically used by a receiver of the system to synchronously process the data, which ensures a recovered clock to be properly aligned to the incoming data. A CDR circuit attempts to recover the clock and data by utilizing a digital filter and a phase interpolator. The digital filter estimates the phase position of upcoming level transitions in a serial data signal; and the phase interpolator controls sampling to occur at an optimal time. The digital filter resembles a feedback control loop that examines the sign of the phase error between the currently recovered clock and the data. If the recovered clock is too early, the phase interpolator delays the clock. If the recovered clock is too late, the phase interpolator advances the clock. A conventional digital loop filter is either a first order filter or a second order filter, which cannot completely cancel the residual jitter of the system, especially when the receiver clock is originally generated based on spread-spectrum. As such, existing CDR circuits are not entirely satisfactory in terms of performance and stability.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
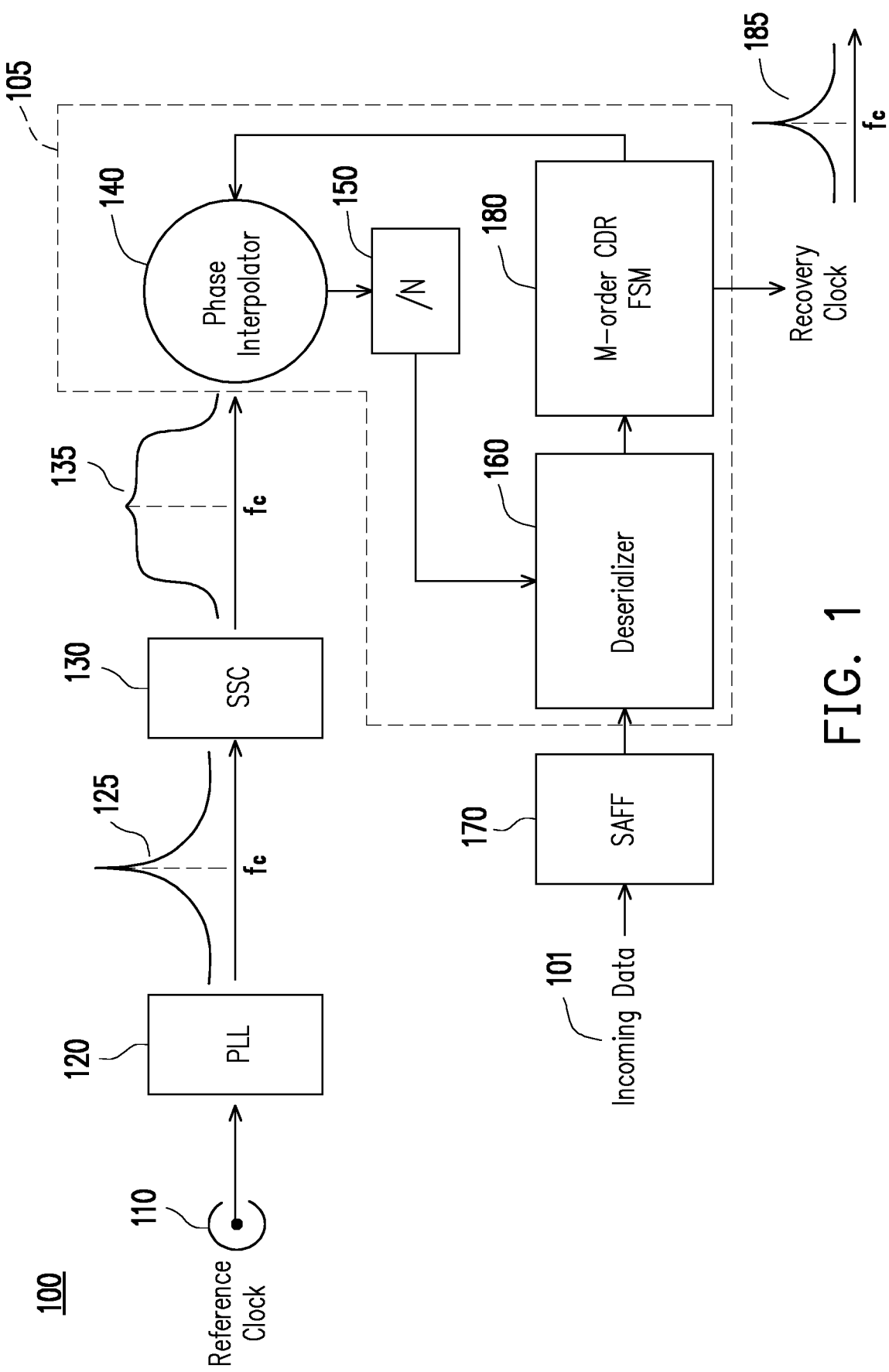
FIG. 1 illustrates an exemplary block diagram of a system including a digital circuit for performing a clock and data recovery, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

A CDR circuit attempts to recover the clock and data by utilizing a digital filter and a phase interpolator. The digital filter estimates the phase position of upcoming level transitions in a serial data signal; and the phase interpolator controls sampling to occur at an optimal time. The digital filter resembles a feedback control loop that examines the sign of the phase error between the currently recovered clock and the data. If the recovered clock is too early, the phase interpolator delays the clock. If the recovered clock is too late, the phase interpolator advances the clock. A conventional digital loop filter is either a first order filter or a second order filter, which cannot completely cancel the residual jitter of the system, especially when the receiver clock is originally generated based on spread-spectrum.

The present disclosure provides various embodiments of a novel CDR circuit and methods for performing CDR for residual jitter cancellation. In some embodiments, the disclosed CDR circuit includes a third order digital filter, e.g. a finite state machine (FSM) that includes three accumulators connected in series. Among the three accumulators, a first accumulator receives an input phase code representing a phase timing difference between a data signal and a clock signal at each FSM cycle and accumulates input phase codes for different FSM cycles to generate a first order phase code at each FSM cycle; a second accumulator accumulates the input phase codes and first order phase codes for different FSM cycles to generate a second order phase code at each FSM cycle; and a third accumulator accumulates the input phase codes and second order phase codes for different FSM cycles to generate a third order phase code at each FSM cycle. The disclosed CDR circuit also includes a phase interpolator configured to rotate a phase of the clock signal based on the third order phase code, to recover clock to be properly aligned to the incoming data. In one embodiment, the third order FSM has a closed loop transfer function that completely cancels residual jitter of the CDR circuit, even if the initial clock signal was generated based on spread-spectrum to reduce the spectral density of the electromagnetic interference (EMI) of the system. In another embodiment, the disclosed CDR circuit may include any kind of k-th order FSM that has k accumulators connected in series, where k is an integer greater than 3.

The present disclosure is applicable to any communication system that includes a CDR circuit. The disclosed CDR circuit can completely cancel the residual jitter of the system. In addition to jitter performance improvement compared to first order or second order CDR circuits, the disclosed CDR circuit improves stability of the system with a phase margin that is higher than or equal to 60 degrees.

FIG. 1 illustrates an exemplary block diagram of a system 100 including a digital circuit 105 for performing a clock and data recovery, in accordance with some embodiments of the present disclosure. In accordance with one embodiment, the system 100 may be part of a receiver in a communication system with a Serializer/Deserializer (SerDes) architecture. A communication system with a SerDes architecture includes a transmitter, a channel, and a receiver. The transmitter may include a linear equalizer, e.g. a feed forward equalizer (FFE), to equalize data before being transmitted. In this example, the transmitter transmits serial data stream (e.g. 0101110 . . . ) to the receiver via the channel, which may be a lossy media typically including chip-packages, cables, daughter-cards and backplanes. The received signals at the output of the channel are apparently noisy and highly-contaminated, but are expected to be completely restored back to the original transmitted bit streams in the end. To achieve this goal, several assistant blocks are included in the receiver, such as continuous time linear equalization (CTLE), decision feedback equalizer (DFE), and a CDR circuit to control the phase (and sometimes the frequency) of the recovered clock for clock alignment.

The clock alignment mentioned above is realized by a closed loop configuration, which is simplified and illustrated in FIG. 1. The loop is basically configured by a phase lock loop (PLL) 120, a spread spectrum clock (SSC) 130, and a CDR circuit 105. The PLL 120 is coupled to a reference clock 110 to serve as a reference clock source. As shown in FIG. 1, the PLL 120 may lock the clock frequency to form a narrow band or a single tone frequency signal 125.

As a reference clock source, when signal energy is highly focused on a single tone, the single tone signal 125 can cause electromagnetic interference (EMI) in the system. The SSC 130, which is connected to the PLL 120, can generate a clock signal 135 with wider bandwidth and less EMI based on the single tone clock signal 125. The SSC 130 can reduce EMI emissions by deliberately dithering the clock to make radiated energy spread across the spectrum and thus reducing its peaks. While the output clock signal 135 has reduced EMI and can meet regulatory or industry specifications, it is not good for clock alignment with incoming data, because residual jitter may easily be generated from the SSC modulation after a clock alignment.

The CDR circuit 105 in this example is designed to perform a clock alignment, i.e. a clock and data recovery, with residual jitter cancellation. The CDR circuit 105 performs the clock and data recovery based on the incoming data 101 and the spread clock signal 135, to generate a recovery clock signal 185, which is again a single tone clock signal. The incoming data 101 may be data received from the transmitter, after some data processing like equalization. In one embodiment, as shown in FIG. 1, the incoming data 101 is further processed by a sense-amplifier flip-flop (SAFF) 170 that can restore the signal voltages of incoming data to their full swing with a high sensitivity. In another embodiment, the SAFF 170 may be included in a DFE (not shown in FIG. 1) for a low-power and low-noise design, to preprocess incoming data 101 before the clock alignment at the CDR circuit 105.

As shown in FIG. 1, the CDR circuit 105 in this example includes a phase interpolator 140, a divider 150, a deserializer 160, and an M-order CDR FSM 180 (M=$1^{st}$, $2^{nd}$, $3^{rd}$ . . . ). In this embodiment, the term M-order means there are at most M accumulators connected in series in the CDR FSM. In general, phase interpolators are used in CDR circuits to generate clock signals with different phases and for picking the clock signal having the proper phase. The phase interpolator 140 in this example receives the single tone clock signal 135 to generate an initial clock signal to be aligned and recovered. To recover the clock, the phase interpolator 140 follows commands from the M-order CDR FSM 180 to rotate the clock signal for alignment at each FSM cycle. In one embodiment, the phase interpolator 140 generates rotated clocks by rotating (shifting) a phase from initial clock based on the initial clock and a phase code generated by the M-order CDR FSM 180. The phase interpolator 140 may store a plurality of candidate rotated clocks that have equal phase differences $\Delta p$. The phase differences may be different according to various embodiments. Phase difference $\Delta p$ is pre-determined, and may be, for example, five degrees, 10 degrees, 15 degrees, or the like. If a first clock signal is rotated from a second clock signal by phase difference $\Delta p$, $2\Delta p$, $3\Delta p$, or the like, the first clock signal is referred to as being rotated from the second clock signal by one step, two steps, three steps, or the like. Further, if the first clock signal is to be rotated to the right (later in time) than the second clock signal, the rotation steps are positive, for example, +1, +2, +3, and the like, and the corresponding phase codes are also +1, +2, +3, and the like. Conversely, if the first clock signal is rotated to the left (earlier in time) than the second clock signal, the rotation steps are negative, for example, −1, −2, −3, or the like, and the corresponding phase codes are also −1, −2, −3, and the like. It can be understood by one skilled the art that this definition can also be reversed. The rotated phase may be linearly correlated to the phase code generated by the M-order CDR FSM 180.

In one example, if the phase code is −1 or +1, then rotated clock signal will be generated by rotating initial clock to the left by one step or to the right by one step, respectively. It can be understood by one skilled the art that the newly generated clock will be used as the initial clock for the next rotation, i.e. at the next FSM cycle. If the phase code is −3, −2, +2, +3, or the like, the phase of the newly generated clock may be shifted from the initial clock more than one step each time, depending on the values of phase code.

The deserializer 160 in this example converts the incoming data 101, which may or may not be processed e.g. by the SAFF 170, from a serial format to a parallel format. The incoming serial data is a high speed single bit operation. Before entering the M-order CDR FSM 180, the serial data is processed by the deserializer 160 to slow down the operation from high speed to low speed. As such, the data is accumulated bit by bit with a slower clock. As shown in FIG. 1, the divider 150 controls the clock source of the deserializer 160, and feeds the initial clock signal generated by the phase interpolator 140 at each FSM cycle into the deserializer 160. Taking serial data single bit 100 ps as an example, if the deserializer 160 is 64 times slower, then the M-order CDR FSM 180 will conduct 64 bits at the same time with a clock speed equal to 100 ps*64=6.4 ns.

In one embodiment, the deserializer 160 receives the incoming data signal and the initial clock signal, generates an input phase code representing the phase timing difference between the incoming data signal and the initial clock signal at each FSM cycle, and sends the input phase code to the M-order CDR FSM 180 for generating an M-order phase code.

The M-order CDR FSM 180 in this example generates an M-order phase code based on the input phase code generated by the deserializer 160. In an embodiment, the M-order CDR FSM 180 has a lower processing rate than the frequency of the incoming data 101. Accordingly, the input phase code signals are parallel signals converted from the serial signal 101. The duration that the M-order CDR FSM 180 receives one input phase code and sends the respective M-order phase code to the phase interpolator 140 is referred to as one FSM cycle.

Each design of the M-order CDR FSM 180 corresponds to a mathematical behavior model of clock alignment loop. In one example, a first order CDR FSM has an open loop transfer function of p/s, where p represents the pole in s domain; and a second order CDR FSM has an open loop transfer function of $$\frac{2\delta\omega_n s + \omega_n^2}{s^2},$$

where δ represents damping factor, and $\omega_n$ represents the natural frequency.

In accordance with various embodiments, the SSC 130 is a triangular SSC modulator having a transfer function of $$\frac{\Delta f / \Delta t}{s^2},$$

where Δf/Δt represents frequency deviation rate due to SSC. Taking 5000 ppm SSC for example, the frequency drifts 5000 ppm within 15 microseconds. Accordingly, the residual jitter in the first order CDR FSM can be derived as below:

$$\lim_{t\to\infty} j(t) = \lim_{s\to 0} sJ(f) = s \cdot \frac{1}{s} \cdot \frac{\Delta f/\Delta t}{s^2} \cdot \frac{s}{s+p} = \frac{\Delta f/\Delta t}{s(s+p)} \quad (1)$$

Accordingly, the residual jitter in the second order CDR FSM can be derived as below:

$$\lim_{t\to\infty} j(t) = \lim_{s\to 0} sJ(f) = s \cdot \frac{1}{s} \cdot \frac{\Delta f/\Delta t}{s^2} \cdot \frac{s^2}{s^2 + 2\delta\omega_n s + \omega_n^2} = \frac{\Delta f/\Delta t}{\omega_n^2} \quad (2)$$

As shown above in equations (1) and (2), the residual jitters in the first order and second order CDR FSMs cannot be cancelled to zero. In a system sense, the resulting residual jitter superimposes significant impacts on both jitter tolerance and power spectrum density. As discussed in detail below, when the M-order CDR FSM 180 has a third or higher order, it will have a capability to completely cancel the residual jitter to zero. After the clock alignment, the M-order CDR FSM 180 outputs a recovery clock signal 185 that is aligned with the incoming data at the receiver. The receiver may perform sampling of the received data according to the aligned clock to recover data that has been transmitted through the lossy channel. A bit error rate testing (BERT) module (not shown in FIG. 1) may be used to calculate a bit error rate (BER) of the communication system, by comparing the recovered data at the receiver with the transmitted data from the transmitter.

Figure 2:
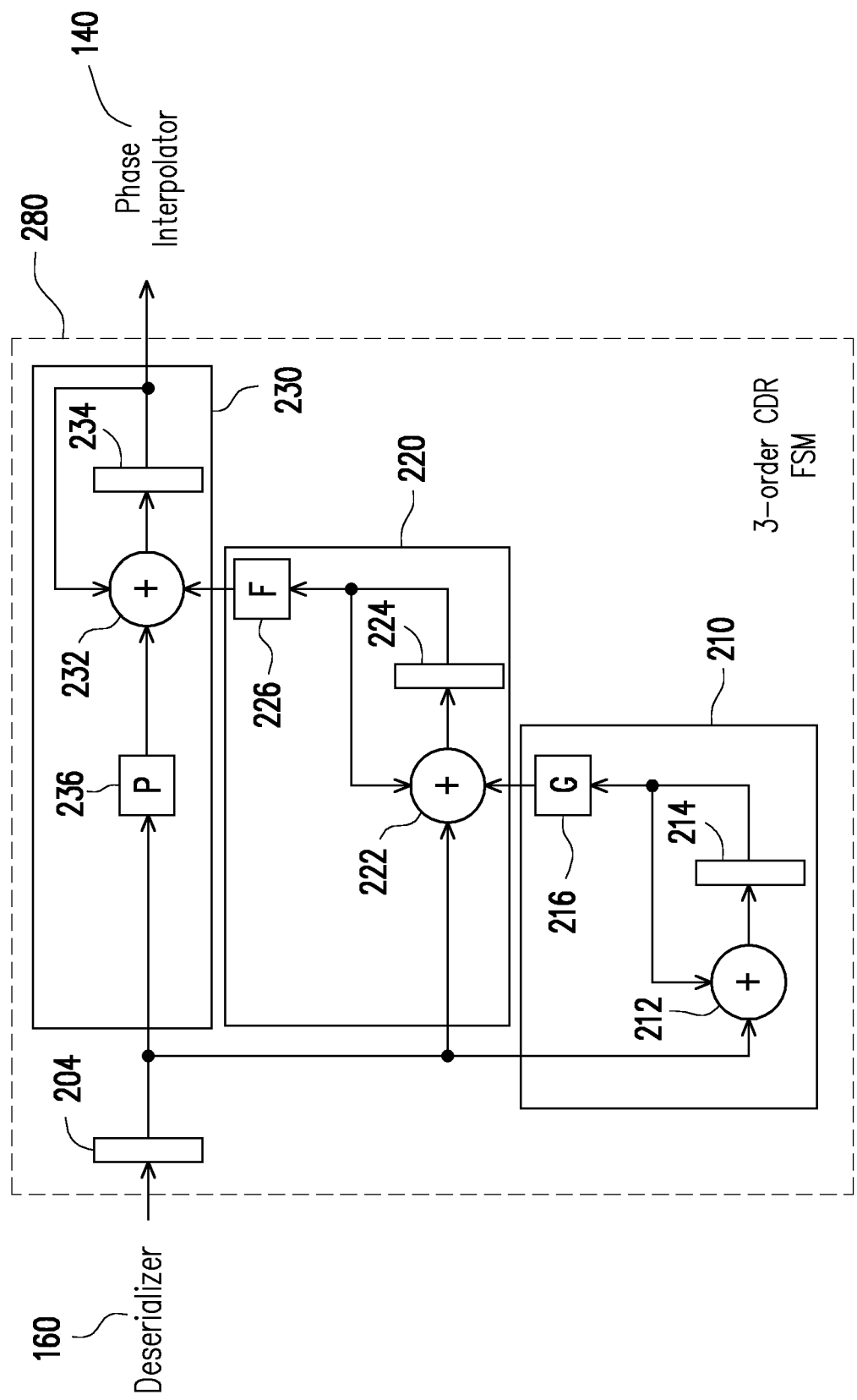
FIG. 2 illustrates an exemplary block diagram of a finite state machine (FSM) in a clock and data recovery circuit, in accordance with some embodiments of the present disclosure.

FIG. 2 illustrates an exemplary block diagram of a third order CDR FSM 280 in a clock and data recovery circuit, in accordance with some embodiments of the present disclosure. In one embodiment, the third order CDR FSM 280 serves as the M-order CDR FSM 180 in the CDR circuit 105 in FIG. 1. As shown in FIG. 2, the third order CDR FSM 280 in this example includes a first accumulator 210, a second accumulator 220, a third accumulator 230, and a flip flop or latch 204. The latch 204 in this example receives and stores the input phase code information generated by the deserializer 160, and provides the stored input phase code to the first accumulator 210, the second accumulator 220, and the third accumulator 230 at each FSM cycle. As discussed above, the input phase code represents a phase timing difference between a data signal and a clock signal at each FSM cycle.

The first accumulator 210 in this example receives the input phase code at each FSM cycle and accumulates input phase codes for different FSM cycles to generate a first order phase code at each FSM cycle. As shown in FIG. 2, the first accumulator 210 includes an adder 212, a delay-type (D-type) flip flop 214, and a filter G 216. The adder 212 can be implemented by logic gates to add two input values together and outputs the sum of the two input values. The D-type flip flop 214 is used for storing data in the past for the first accumulator 210.

An accumulator is a circuit to accumulate the data from the past up to now. With the D-type flip flop 214 for data storage, the adder 212 can add up data from a previous FSM cycle and a new input phase code from the latch 204. For example, the equation performed by the adder 212 can be shown as: x[n]=x[n−1]+Input[n−1], where n is the time index, i.e. FSM cycle number, x represents data, i.e. accumulated phase code here, and Input represents input phase code from the latch 204.

The adder 212 outputs the newly accumulated phase code to the D-type flip flop 214 for data storage at each FSM cycle, such that the stored phase code can be used for accumulation at next FSM cycle. In addition, the D-type flip flop 214 also outputs the stored phase code, referred to as first order phase code, to the second accumulator 220 via the filter G 216 at each FSM cycle.

The filter G 216 in this example can modify the stored phase code from the D-type flip flop 214 to generate the first order phase code at a current FSM cycle, and provides it to the second accumulator 220 for accumulation. For example, the filter G 216 may be a digital filter that modifies an intensity of the stored phase code, by scaling up or down the stored phase code or keeping it unchanged, before providing it to the second accumulator 220. In accordance with various embodiments, the filter G 216 may be placed in the first accumulator 210, in the second accumulator 220 or between the first accumulator 210 and the second accumulator 220.

The second accumulator 220 in this example receives the input phase code and the first order phase code at each FSM cycle and accumulates the input phase codes and first order phase codes for different FSM cycles to generate a second order phase code at each FSM cycle. As shown in FIG. 1, the second accumulator 220 includes an adder 222, a D-type flip flop 224, and a filter F 226. The adder 222 can be implemented by logic gates to add two input values together and outputs the sum of the two input values. The D-type flip flop 224 is used for storing data in the past for the second accumulator 220. An accumulator is a circuit to accumulate the data from the past up to now. With the D-type flip flop 224 for data storage, the adder 222 can add up data from a previous FSM cycle, a new input phase code from the latch 204, and a new first order phase code from the first accumulator 210.

The adder 222 outputs the newly accumulated phase code to the D-type flip flop 224 for data storage at each FSM cycle, such that the stored phase code can be used for accumulation at next FSM cycle. In addition, the D-type flip flop 224 also outputs the stored phase code, referred to as second order phase code, to the third accumulator 230 via the filter F 226 at each FSM cycle. The filter F 226 in this example can modify the stored phase code from the D-type flip flop 224 to generate the second order phase code at a current FSM cycle, and provides it to the third accumulator 230 for accumulation. For example, the filter F 226 may be a digital filter that modifies an intensity of the stored phase code at the D-type flip flop 224, by scaling up or down the stored phase code or keeping it unchanged, before providing it to the third accumulator 230. In accordance with various embodiments, the filter F 226 may be placed in the second accumulator 220, in the third accumulator 230 or between the second accumulator 220 and the third accumulator 230.

The third accumulator 230 in this example receives the input phase code and the second order phase code at each FSM cycle and accumulates the input phase codes and second order phase codes for different FSM cycles to generate a third order phase code at each FSM cycle. As shown in FIG. 1, the third accumulator 230 includes an adder 232, a D-type flip flop 234, and a filter P 236. The filter P 236 in this example can modify the input phase code from the latch 204 to generate a modified input phase code at a current FSM cycle, and provide it to the adder 232 for accumulation. For example, the filter P 236 may be a digital filter that modifies an intensity of the input phase code, by scaling up or down the input phase code or keeping it unchanged, before providing it to the adder 232. In accordance with various embodiments, the filter P 236 may be placed in or outside the third accumulator 230.

The adder 232 can be implemented by logic gates to add two input values together and outputs the sum of the two input values. The D-type flip flop 234 is used for storing data in the past for the third accumulator 230. With the D-type flip flop 234 for data storage, the adder 232 can add up data from a previous FSM cycle, a modified input phase code from the filter P 236, and a new second order phase code from the second accumulator 220. The adder 232 outputs the newly accumulated phase code to the D-type flip flop 234 for data storage at each FSM cycle, such that the stored phase code can be used for accumulation at next FSM cycle. In addition, the D-type flip flop 234 also outputs the stored phase code, referred to as third order phase code, to the phase interpolator 140 at each FSM cycle.

There are three accumulators connected in series in the third order CDR FSM 280. Accordingly, the third order CDR FSM 280 has an open loop transfer function of $$\frac{s^2 P + sF + GF}{s^3},$$

where G, F, P represent scaling factors associated with the filter G 216, the filter F 226, and the filter P 236, respectively. For example, each of G, F, P may be 0.5, 0.8, 1, 1.5, 2, etc. With appropriate design, the values of G, F, P can help improving the performance of jitter tolerance and phase margin of the CDR circuit.

A corresponding closed loop frequency response for the third order CDR FSM 280 can be derived as $$\frac{s^3}{s^3 + s^2 P + sF + GF}.$$

Here, a cubic $s^3$ in the numerator is subsequently created to completely eliminate the effect of the triangular SSC modulation. As such, the residual jitter in a third order CDR FSM can be derived as below:

$$\lim_{t \to \infty} j(t) = \lim_{s \to 0} sJ(f) = s \cdot \frac{1}{s} \cdot \frac{\Delta f / \Delta t}{s^2} \cdot \frac{s^3}{s^3 + As^2 + Bs + C} = 0 \quad (3)$$

where A=P, B=F, and C=GF in the example above. In contrast to equations (1) and (2), the residual jitter shown in equation (3) for the third order CDR FSM is completely cancelled, i.e. cancelled to zero.

Figure 3:
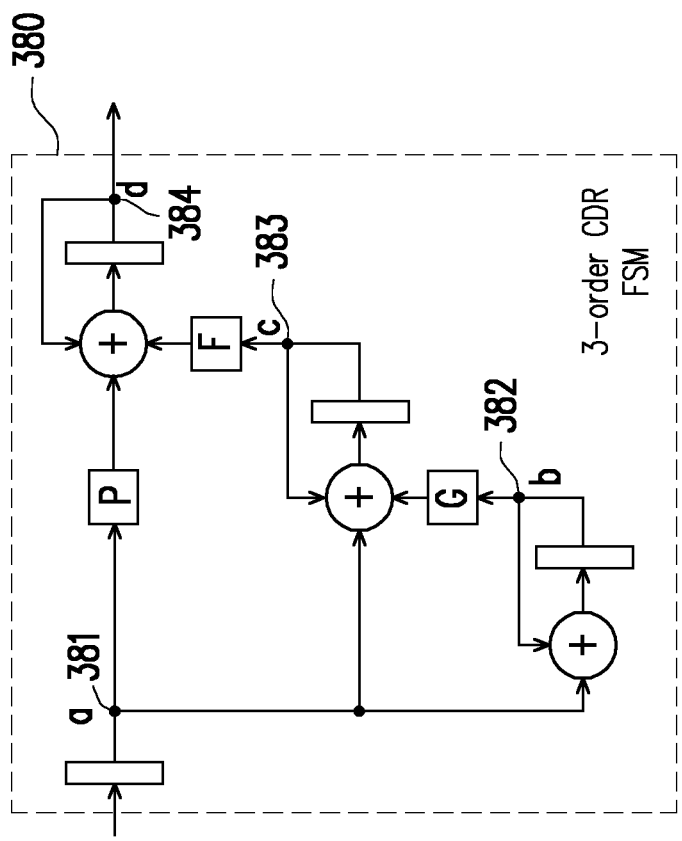
FIG. 3 illustrates exemplary phase codes generated at different nodes in an FSM at different FSM cycles, in accordance with some embodiments of the present disclosure.
Figure 3:
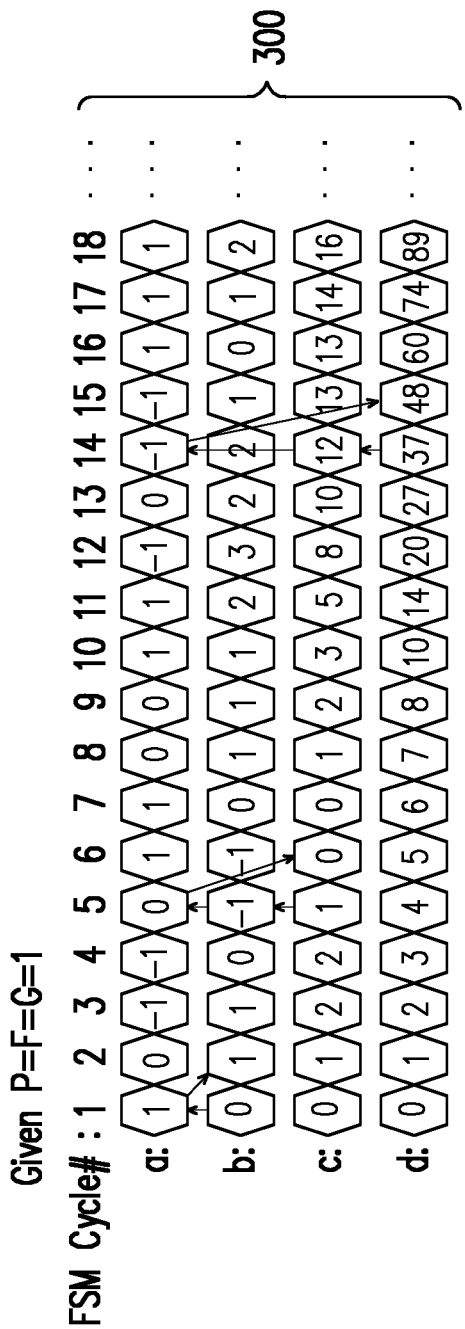

FIG. 3 illustrates exemplary phase codes generated at different nodes in an FSM 380 at different FSM cycles, in accordance with some embodiments of the present disclosure. In one embodiment, the FSM 380 has the same architecture as the third order CDR FSM 280 and serves as the M-order CDR FSM 180 in the CDR circuit 105 in FIG. 1. FIG. 3 shows an array 300 of phase codes generated at node a 381, node b 382, node c 383, and node d 384, at different FSM cycles. Referring to FIG. 2 and FIG. 3 together, node a 381 is located at the output of the latch 204; node b 382 is located at the output of the D-type flip flop 214; node c 383 is located at the output of the D-type flip flop 224; and node d 384 is located at the output of the D-type flip flop 234. In this example, it is assumed P=F=G=1 for simplicity and without loss of generality.

As shown in the array 300 of FIG. 3, at any given FSM cycle, the phase code at node a 381 is 0, 1, or −1, which e.g. represents that the clock signal is aligned with, earlier than, or later than the recovered data signal, respectively. While the node b 382 has an initial phase code value 0 at FSM cycle 1, the phase code value of the node b 382 at each of the other FSM cycles can be calculated by adding the value of the node a 381 and the value of the node b 382 at a previous FSM cycle. This is because the first accumulator 210 accumulates input phase codes for different FSM cycles to generate a first order phase code at each FSM cycle, as discussed above.

In addition, as shown in the array 300 of FIG. 3, while the node c 383 has an initial phase code value 0 at FSM cycle 1, the phase code value of the node c 383 at each of the other FSM cycles can be calculated by adding the value of the node a 381, the value of the node b 382, and the value of the node c 383 at a previous FSM cycle. This is because the second accumulator 220 accumulates the input phase codes and first order phase codes for different FSM cycles to generate a second order phase code at each FSM cycle, as discussed above.

Further, as shown in the array 300 of FIG. 3, while the node d 384 has an initial phase code value 0 at FSM cycle 1, the phase code value of the node d 384 at each of the other FSM cycles can be calculated by adding the value of the node a 381, the value of the node c 383, and the value of the node d 384 at a previous FSM cycle. This is because the third accumulator 230 accumulates the input phase codes and second order phase codes for different FSM cycles to generate a third order phase code at each FSM cycle, as discussed above.

Figure 4:
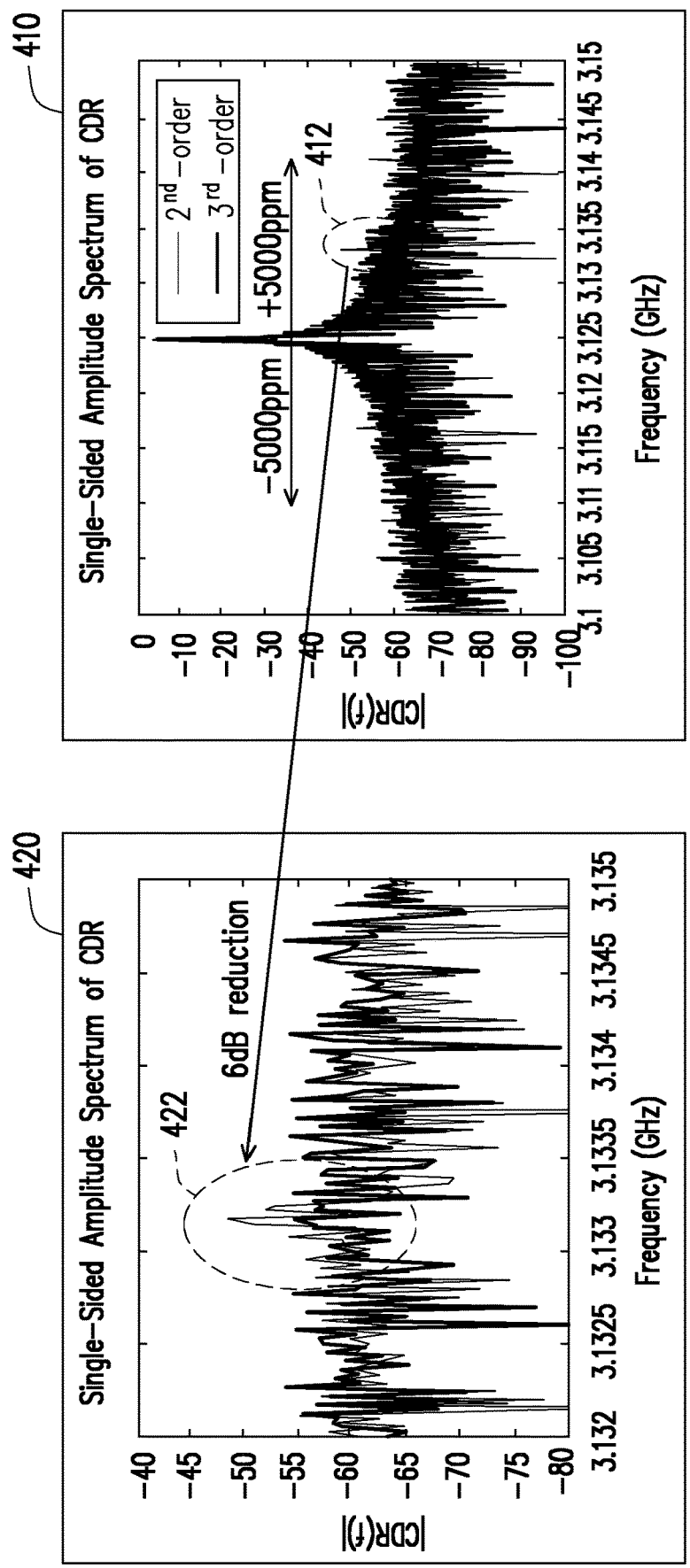
FIG. 4 illustrates a power spectrum density performance of a clock and data recovery circuit, in accordance with some embodiments of the present disclosure.

FIG. 4 illustrates a power spectrum density performance of a clock and data recovery circuit, e.g. the CDR circuit 105 in FIG. 1, in accordance with some embodiments of the present disclosure. As shown in FIG. 4, the plot 410 shows the power spectrum density performances for two recovered clocks with the second order and third order CDR architectures respectively. The plot 410 shows that the single sided amplitude spectrum of the third order CDR architecture has less or minor spurs than that in the single sided amplitude spectrum of the second order CDR architecture. A big spur in this example represents a residual jitter from the power spectrum density's point of view. For example, the third order CDR has a 6 dB reduction compared to the second order CDR at a spurious frequency 412, without compromising the other spectrums of interest. The spur reduction has been zoomed in at 422 in the plot 420 for better visibility.

Figure 5:
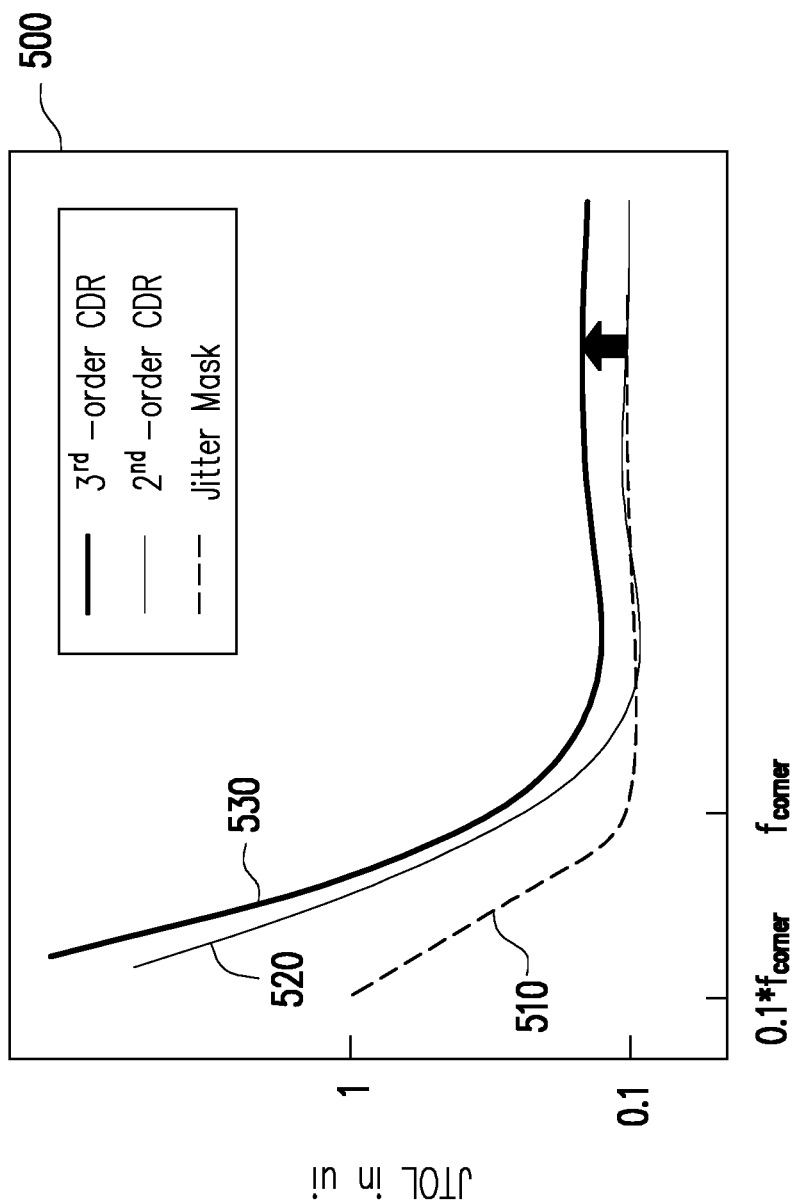
FIG. 5 illustrates a jitter tolerance performance of a clock and data recovery circuit, in accordance with some embodiments of the present disclosure.

FIG. 5 illustrates a jitter tolerance performance of a clock and data recovery circuit, e.g. the CDR circuit 105 in FIG. 1, in accordance with some embodiments of the present disclosure. FIG. 5 shows a comparison between jitter tolerance performances of two recovered clocks of the second order and third order CDR architectures respectively, when a 5000 ppm SSC frequency modulation is applied, e.g. at the SSC 130. As shown in FIG. 5, the jitter tolerance curve 520 of the second order CDR FSM fails to pass above the curve of the industrial jitter mask 510, according to the specification of IEEE P802.3bs. In contrast, the jitter tolerance curve 530 of the third order CDR FSM does pass above the curve of the industrial jitter mask 510, which recovers the jitter tolerance loss of the second order CDR FSM even with the 5000 ppm SSC modulation. This shows the efficacy of the disclosed CDR circuit in terms of jitter tolerance performance.

Figure 6:
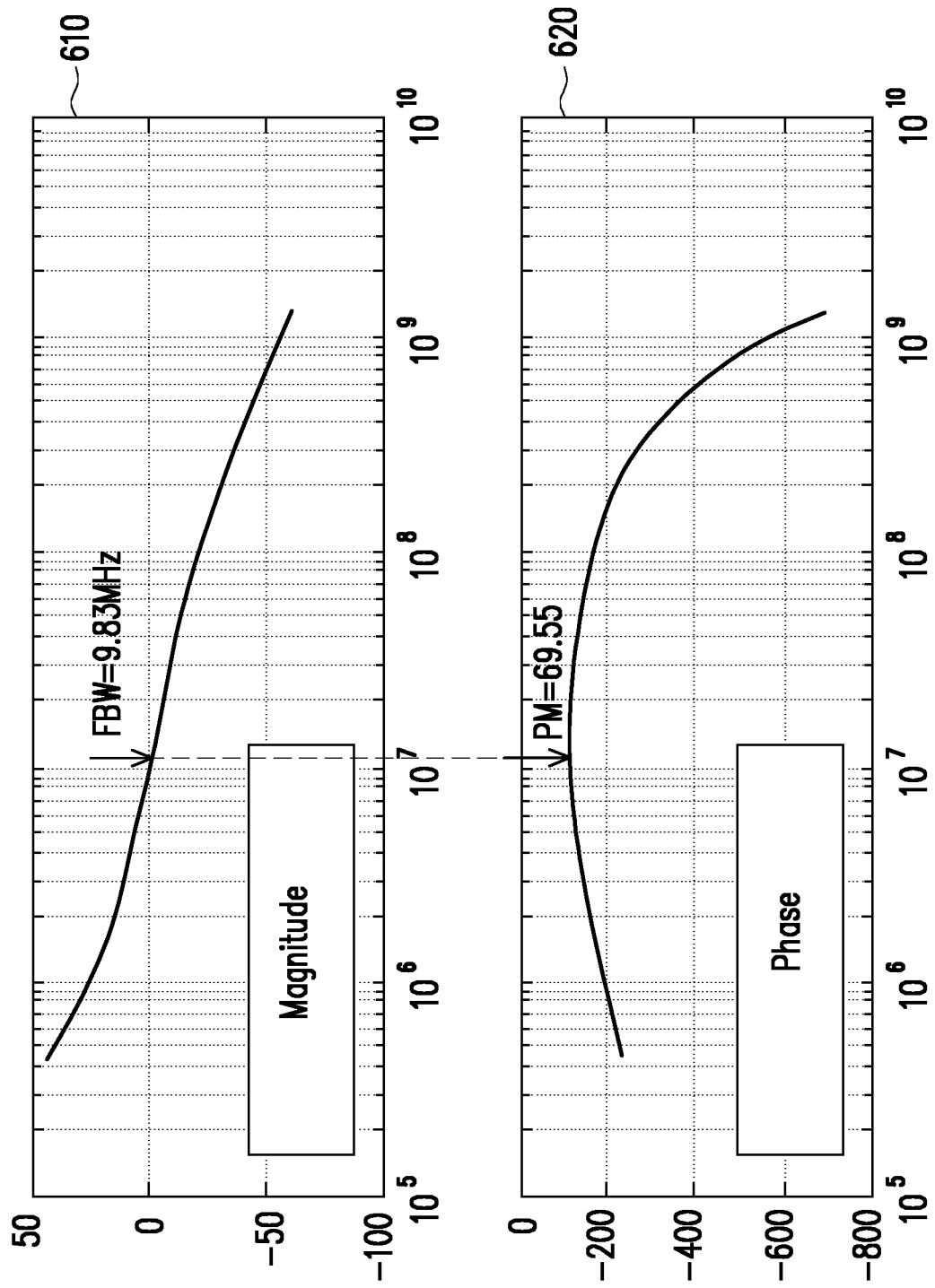
FIG. 6 illustrates a phase margin performance of a clock and data recovery circuit, in accordance with some embodiments of the present disclosure.

FIG. 6 illustrates a phase margin performance of a clock and data recovery circuit, e.g. the CDR circuit 105 in FIG. 1, in accordance with some embodiments of the present disclosure. As shown in FIG. 6, the magnitude plot 610 of the third order CDR FSM shows a frequency bandwidth (FBW) of 9.83 MHz at 0 dB magnitude. Corresponding to this 9.83 MHz bandwidth, the phase plot 620 of the third order CDR FSM shows a phase margin (PM) of 69.55 degrees, larger than a phase margin target of 60 degrees. The represents a high stability of the system adopting the third order CDR, given the phase margin target of 60 degrees. In one embodiment, the phase margin of the third order CDR circuit depends on the values of the scaling factors P, F, G of the corresponding filters in FIG. 2.

Figure 7:
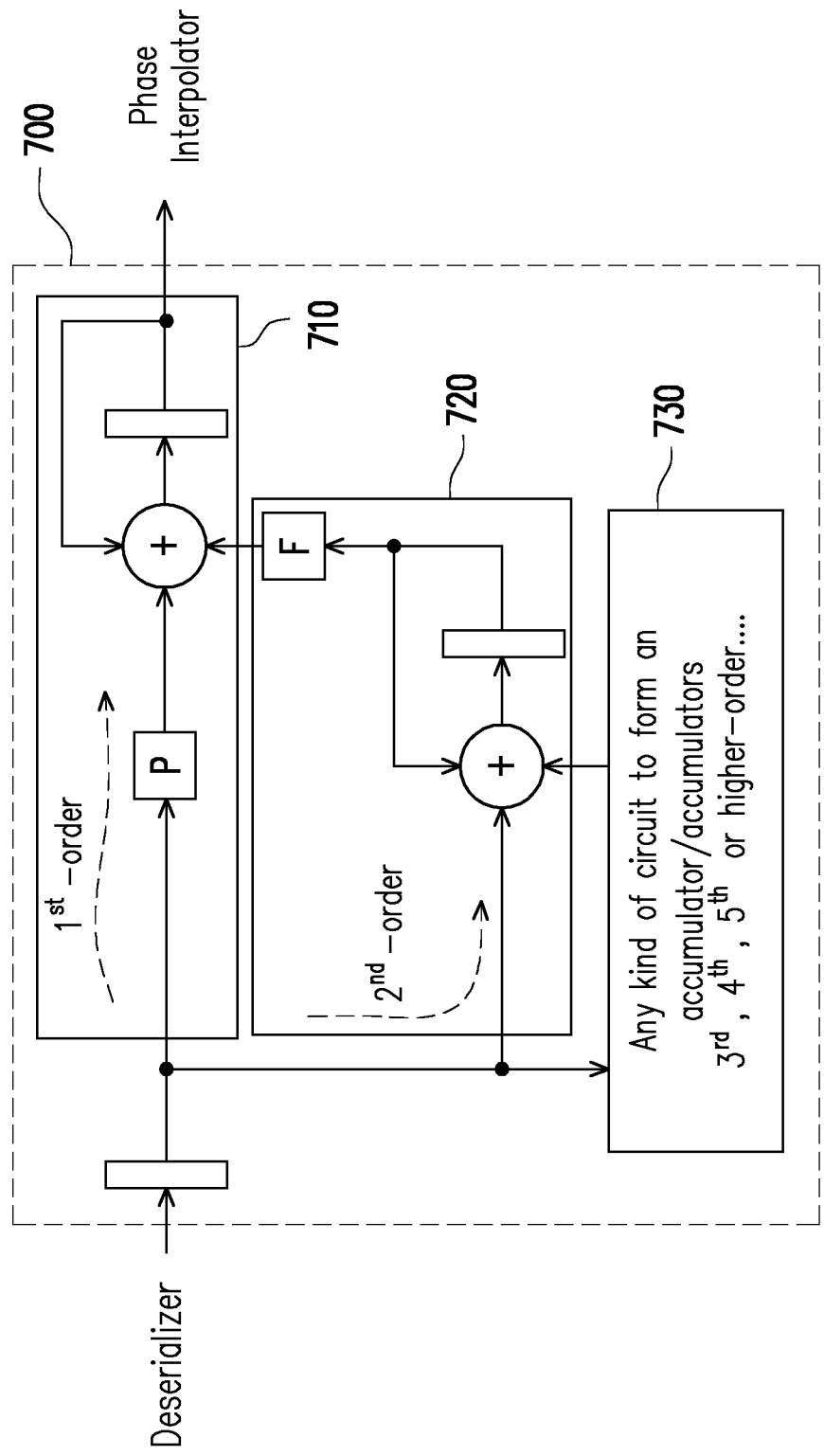
FIG. 7 illustrates another exemplary block diagram of an FSM in a clock and data recovery circuit, in accordance with some embodiments of the present disclosure.

FIG. 7 illustrates another exemplary block diagram of an FSM 700 in a clock and data recovery circuit, e.g. the CDR circuit 105 in FIG. 1, in accordance with some embodiments of the present disclosure. In this example, the FSM 700 has a first order accumulator 710, a second order accumulator 720, and one or more accumulators 730 that may include higher order accumulators, e.g. third order accumulator, fourth order accumulator, fifth order accumulator, etc. These accumulators in FIG. 7 are connected in series as those accumulators in FIG. 2. It can be understood by one skilled in the art that once the accumulators are connected in series, there references may be reversed in order. For example, when there are M accumulators in the FSM 700, where M is an integer greater than or equal to 3, the first order accumulator 710 may be renamed as an end accumulator or the M-order accumulator; the second order accumulator 720 may be renamed as the (M−1)-order accumulator, so on and so forth. Similar to the third order CDR FSM, the CDR FSM having a fourth or higher order can also have a closed loop transfer function that cancels residual jitter of the CDR circuit to zero.

Figure 8:
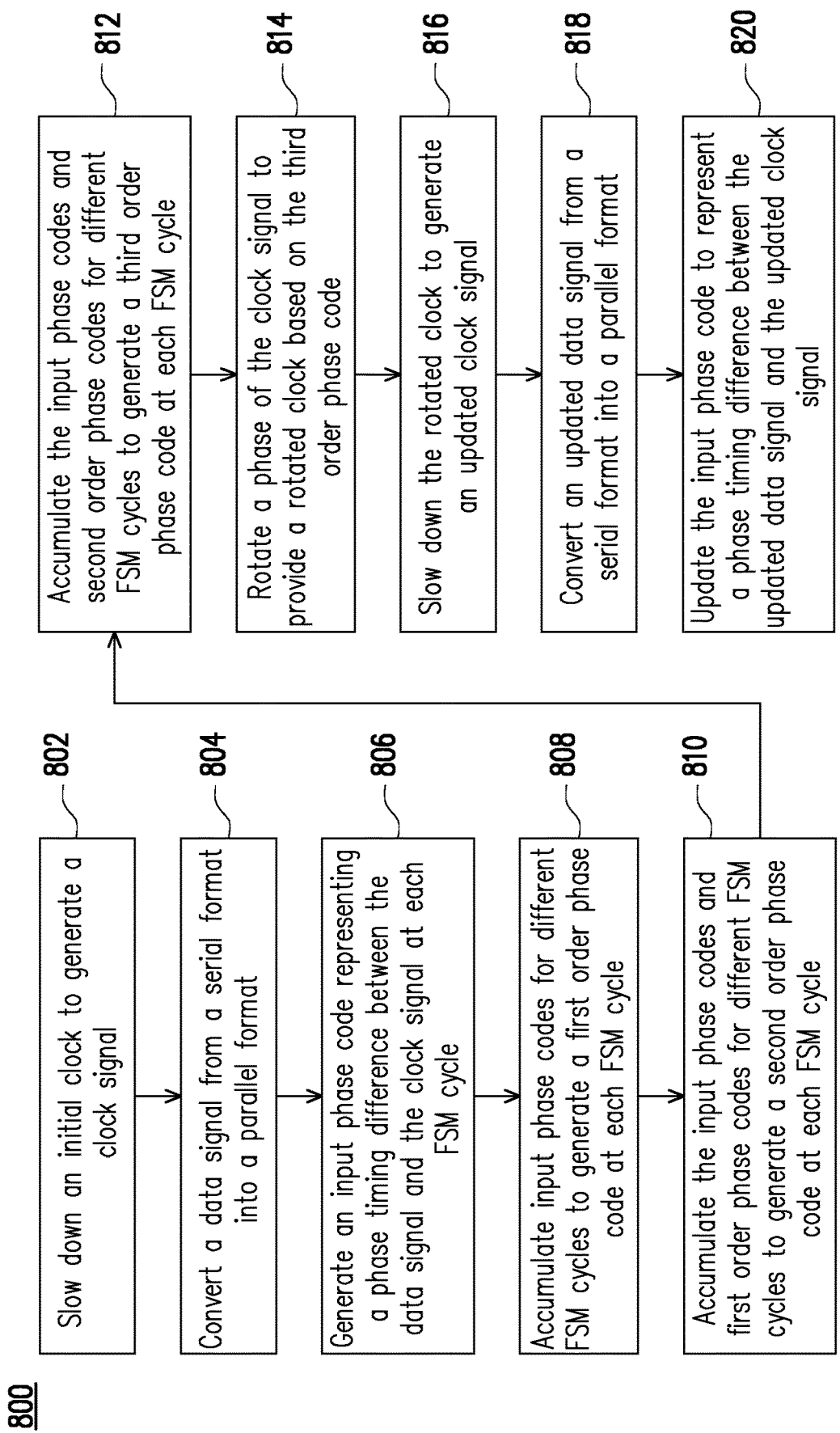
FIG. 8 is a flow chart illustrating an exemplary method for performing a clock and data recovery, in accordance with some embodiments of the present disclosure.

FIG. 8 is a flow chart illustrating an exemplary method 800 for performing a clock and data recovery, in accordance with some embodiments of the present disclosure. At operation 802, an initial clock is slowed down to generate a clock signal. A data signal is converted at operation 804 from a serial format into a parallel format. An input phase code representing a phase timing difference between the data signal and the clock signal is generated at operation 806 at each FSM cycle. Input phase codes for different FSM cycles are accumulated at operation 808 to generate a first order phase code at each FSM cycle. The input phase codes and first order phase codes for different FSM cycles are accumulated at operation 810 to generate a second order phase code at each FSM cycle. The input phase codes and second order phase codes for different FSM cycles are accumulated at operation 812 to generate a third order phase code at each FSM cycle. A phase of the clock signal is rotated at operation 814 to provide a rotated clock based on the third order phase code. The rotated clock is slowed down at operation 816 to generate an updated clock signal. An updated data signal is converted at operation 818 from a serial format into a parallel format. At operation 820, the input phase code is updated to represent a phase timing difference between the updated data signal and the updated clock signal. It can be understood by one skilled in the art that the order of the steps shown in FIG. 8 may be changed according to different embodiments of the present disclosure.

In an embodiment, a circuit is disclosed. The circuit includes an FSM. The FSM includes: a first accumulator, a second accumulator, and a third accumulator. The first accumulator is configured to receive an input phase code representing a phase timing difference between a data signal and a clock signal at each FSM cycle, to accumulate input phase codes for different FSM cycles, and to generate a first order phase code at each FSM cycle. The second accumulator is coupled to the first accumulator and configured to accumulate the input phase codes and first order phase codes for different FSM cycles, and to generate a second order phase code at each FSM cycle. The third accumulator is coupled to the second accumulator and configured to accumulate the input phase codes and second order phase codes for different FSM cycles, and to generate a third order phase code at each FSM cycle.

In another embodiment, a circuit is disclosed. The circuit includes: an FSM and a phase interpolator. The FSM includes: a first accumulator and a second accumulator. The first accumulator is configured to receive an input phase code representing a phase timing difference between a data signal and a clock signal at each FSM cycle, to accumulate input phase codes for different FSM cycles, and to generate a first order phase code at each FSM cycle. The second accumulator is coupled to the first accumulator and configured to accumulate the input phase codes and first order phase codes for different FSM cycles, and to generate a second order phase code at each FSM cycle. The phase interpolator is configured to rotate a phase of the clock signal to provide a rotated clock based on the second order phase code.

In yet another embodiment, a method is disclosed. The method includes: generating an input phase code representing a phase timing difference between a data signal and a clock signal at each FSM cycle; accumulating input phase codes for different FSM cycles to generate a first order phase code at each FSM cycle; accumulating the input phase codes and first order phase codes for different FSM cycles to generate a second order phase code at each FSM cycle; and accumulating the input phase codes and second order phase codes for different FSM cycles to generate a third order phase code at each FSM cycle.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first accumulator configured to receive an input phase code representing a phase timing difference between a data signal and a clock signal at each finite state machine (FSM) cycle, to accumulate input phase codes for different FSM cycles, and to generate a first order phase code at each FSM cycle;
   a second accumulator coupled to the first accumulator and configured to accumulate the input phase codes and first order phase codes for different FSM cycles, and to generate a second order phase code at each FSM cycle; and
   a third accumulator coupled to the second accumulator.

2. The circuit of claim 1, wherein the first accumulator comprises:
   a first flip flop configured to store a first phase code at a previous FSM cycle;
   a first adder configured to add the first phase code at the previous FSM cycle and the input phase code at current FSM cycle to generate the first phase code at the current FSM cycle; and
   a first filter configured to modify the first phase code at the current FSM cycle to generate the first order phase code at the current FSM cycle.

3. The circuit of claim 2, wherein the second accumulator comprises:
   a second flip flop configured to store a second phase code at a previous FSM cycle;
   a second adder configured to add the second phase code at the previous FSM cycle, the first order phase code at the current FSM cycle, and the input phase code at the current FSM cycle to generate the second phase code at the current FSM cycle; and
   a second filter configured to modify the second phase code at the current FSM cycle to generate the second order phase code at the current FSM cycle.

4. The circuit of claim 3, wherein the third accumulator comprises:
   a third filter configured to modify the input phase code to generate a modified input phase code at the current FSM cycle;
   a third flip flop configured to store a third phase code at a previous FSM cycle; and
   a third adder configured to add the third phase code at the previous FSM cycle, the second order phase code at the current FSM cycle, and the modified input phase code at the current FSM cycle to generate a third order phase code at the current FSM cycle.

5. The circuit of claim 1, further comprising:
   a phase interpolator configured to rotate a phase of the clock signal to provide a rotated clock.

6. The circuit of claim 5, wherein:
   the third accumulator is configured to accumulate the input phase codes and second order phase codes for different FSM cycles, and to generate a third order phase code at each FSM cycle; and
   the phase of the clock signal is linearly correlated to the third order phase code.

7. The circuit of claim 1, further comprising:
   a divider configured to slow down an initial clock provided by the phase interpolator to generate the clock signal; and
   a deserializer configured to convert the data signal from a serial format into a parallel format and to generate the input phase code representing the phase timing difference between the data signal and the clock signal.

8. The circuit of claim 7, wherein:
   the divider is further configured to slow down the rotated clock provided by the phase interpolator to generate an updated clock signal; and
   the deserializer is further configured to convert an updated data signal from a serial format into a parallel format and to update the input phase code to represent a phase timing difference between the updated data signal and the updated clock signal.

9. The circuit of claim 7, further comprising:

a fourth flip flop configured to store the input phase code generated by the deserializer and to provide the stored input phase code to the first accumulator, the second accumulator, and the third accumulator at each FSM cycle.

10. The circuit of claim 1, wherein the first accumulator, the second accumulator and the third accumulator form a FSM having a closed loop transfer function that cancels residual jitter of the circuit.

11. The circuit of claim 1, wherein the first accumulator, the second accumulator and the third accumulator form a FSM having a phase margin higher than or equal to 60 degrees.

12. A circuit, comprising:
a deserializer configured for generating an input phase code representing a phase timing difference between a data signal and a clock signal at each finite state machine (FSM) cycle; and
a finite state machine (FSM) configured for accumulating input phase codes for different FSM cycles to generate a phase code at each FSM cycle, wherein the phase code has an order that is higher than two.

13. The circuit of claim 12, wherein:
the deserializer is configured to convert the data signal from a serial format into a parallel format to generate the input phase code.

14. The circuit of claim 12, wherein accumulating input phase codes comprises:
generating a first order phase code at each FSM cycle; and
accumulating the input phase codes and first order phase codes for different FSM cycles to generate a second order phase code at each FSM cycle.

15. The circuit of claim 14, wherein accumulating input phase codes further comprises:

accumulating the input phase codes and second order phase codes for different FSM cycles to generate a third order phase code at each FSM cycle.

16. The circuit of claim 12, further comprising:
a phase interpolator configured to rotate a phase of the clock signal to provide a rotated clock based on the phase code having an order that is higher than two.

17. A method, comprising:
slowing down an initial clock to generate a clock signal;
converting a data signal from a serial format into a parallel format;
generating an input phase code representing a phase timing difference between the data signal and the clock signal at each finite state machine (FSM) cycle;
accumulating input phase codes for different FSM cycles to generate a plurality of phase codes at each FSM cycle; and
rotating a phase of the clock signal to provide a rotated clock based on a highest order phase code among the plurality of phase codes.

18. The method of claim 17, wherein the phase is linearly correlated to the highest order phase code.

19. The method of claim 17, wherein the highest order phase code has an order that is higher than two.

20. The method of claim 17, further comprising:
slowing down the rotated clock to generate an updated clock signal;
converting an updated data signal from a serial format into a parallel format; and
updating the input phase code to represent a phase timing difference between the updated data signal and the updated clock signal.

* * * * *